United States Patent [19]

Randall

[11] Patent Number: 4,695,742

[45] Date of Patent: Sep. 22, 1987

[54] CHARGE BALANCE VOLTAGE-TO-FREQUENCY CONVERTER UTILIZING CMOS CIRCUITRY

[75] Inventor: Bruce E. Randall, Rock Hill, N.C.

[73] Assignee: Sangamo Weston, Inc., Norcross, Ga.

[21] Appl. No.: 8,102

[22] Filed: Jan. 20, 1987

Related U.S. Application Data

[63] Continuation of Ser. No. 492,533, May 9, 1983, abandoned.

[51] Int. Cl.[4] .......................... H03L 7/00; H03K 5/00
[52] U.S. Cl. .................................... 307/271; 307/261; 307/350; 328/127; 328/150
[58] Field of Search ............... 307/271, 261, 350, 359, 307/519; 328/127, 150, 151

[56] References Cited

U.S. PATENT DOCUMENTS

| | | | |
|---|---|---|---|
| 3,389,271 | 6/1960 | Gray | 307/271 |
| 3,539,825 | 11/1970 | Hardaway | 307/271 |
| 3,560,864 | 2/1971 | Nihof | 307/271 |
| 3,968,447 | 7/1976 | Baylac et al. | 328/127 |
| 4,021,658 | 5/1977 | Rhodes et al. | 328/127 |
| 4,031,532 | 6/1977 | First | 307/519 |
| 4,109,168 | 8/1978 | Raymond | 328/127 |
| 4,410,812 | 10/1983 | Honig et al. | 328/127 |

OTHER PUBLICATIONS

8032 Electronics International, vol. 55 (1982), Jun., No. 11, New York, U.S.A., pp. 149-151.

Primary Examiner—Stanley D. Miller
Assistant Examiner—Timothy P. Callahan
Attorney, Agent, or Firm—Dale Gaudier

[57] ABSTRACT

A charge balance voltage-to-frequency converter utilizes CMOS circuitry to provide a digital pulse output proportional to an analog input signal. The converter approaches a desired charge balance by cycling between a charging and a discharging state. A clock signal provided by a stable oscillator is applied to a clock input of a CMOS D-type flip-flop. The analog input signal effectively is fed to a non-inverting input of an integrating amplifier. The output of the integrating amplifier is fed to the D input of the flip-flop, which input has a threshold level. The Q output of the flip-flop is connected via a voltage divider to an inverting input of the integrating amplifier. This configuration eliminates the need for a dual polarity power supply. When the output of the integrating amplifier rises above the threshold level of the D input, on the next rising edge of the clock signal, the flip-flop sends feedback pulses to the inverting input, thus beginning the discharge state. Each feedback pulse causes the integrating amplifier to discharge a predetermined amount. When the output of the integrating amplifier falls below the D input threshold level, feedback pulses are inhibited, and the charging state begins again. The output pulses from the flip-flop, when accumulated over a period of time, represent the charge required to balance the charge provided by the input signal. The feedback pulses are summed by an accumulator to provide an indication of the converter input.

13 Claims, 6 Drawing Figures

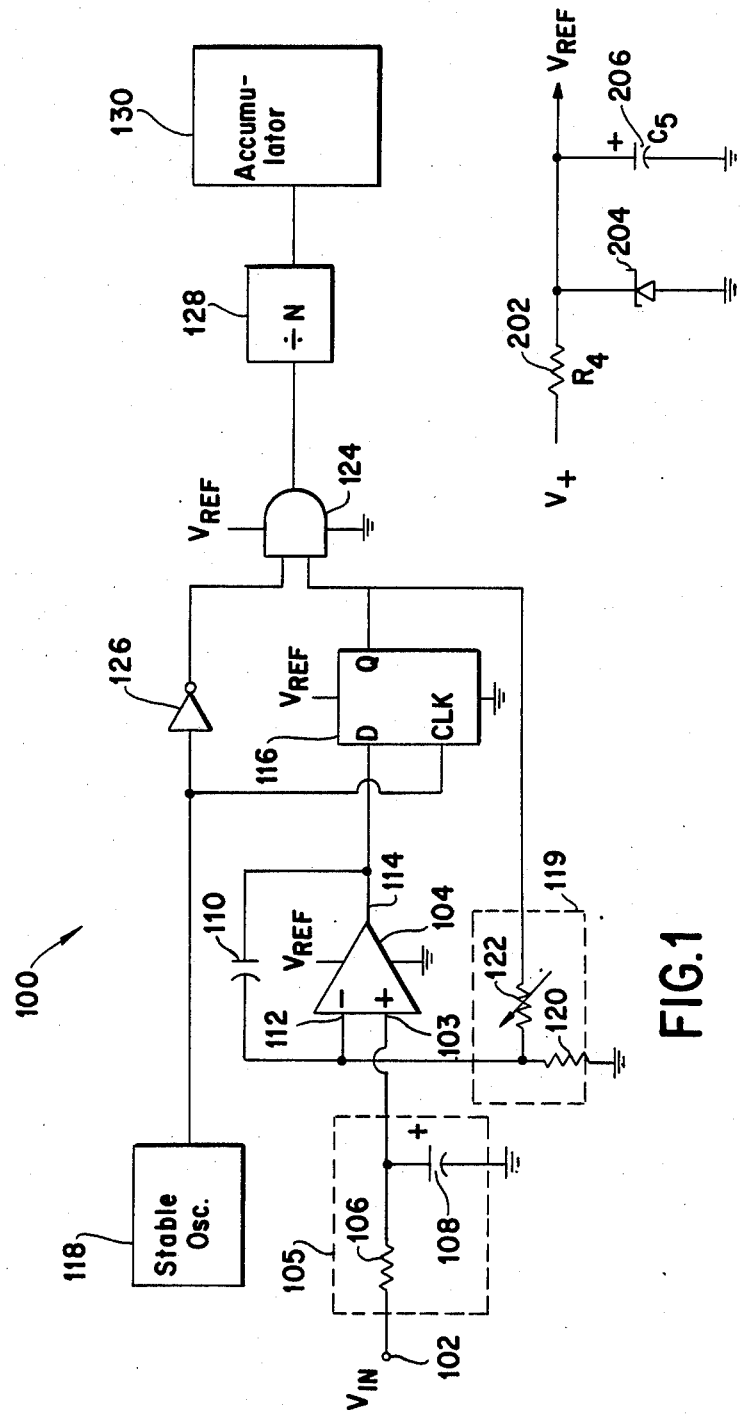

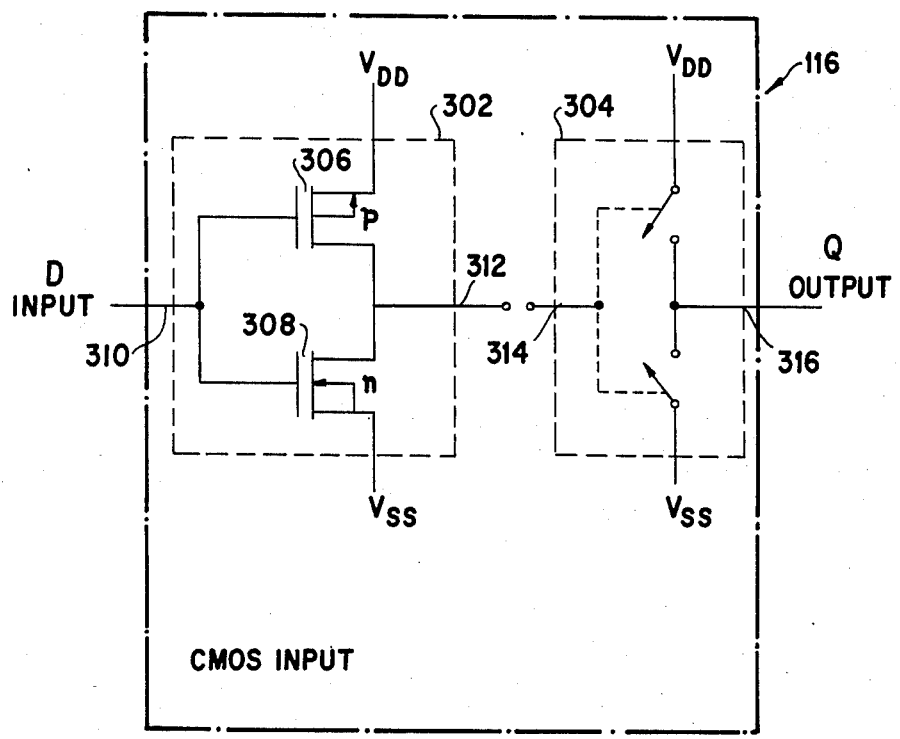
FIG.3
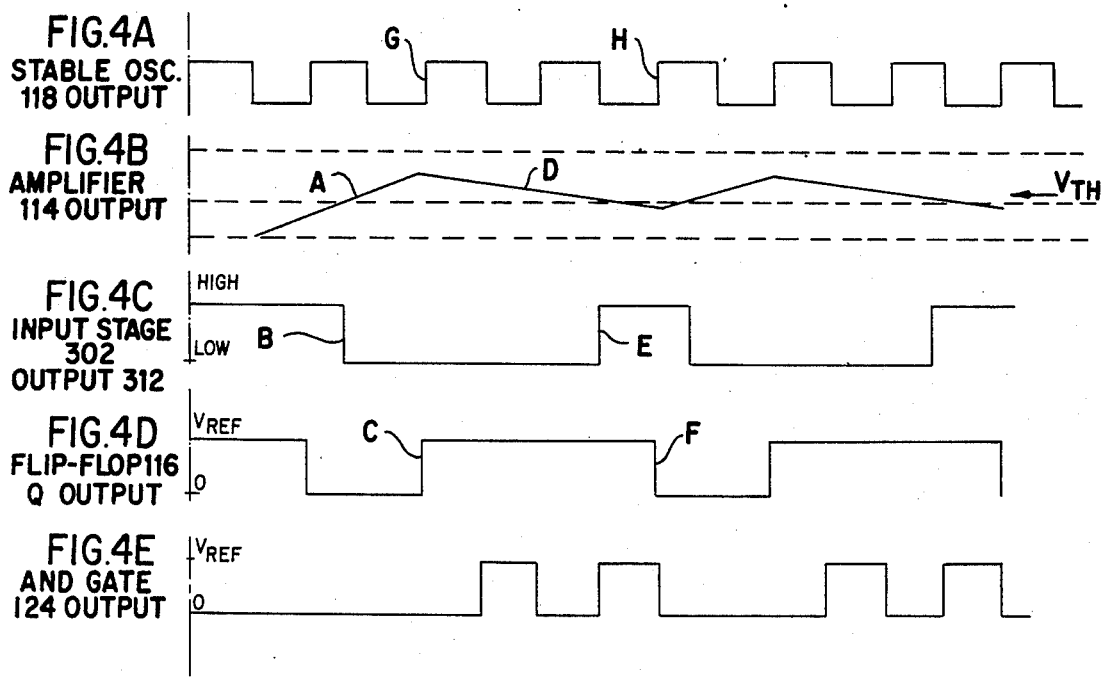

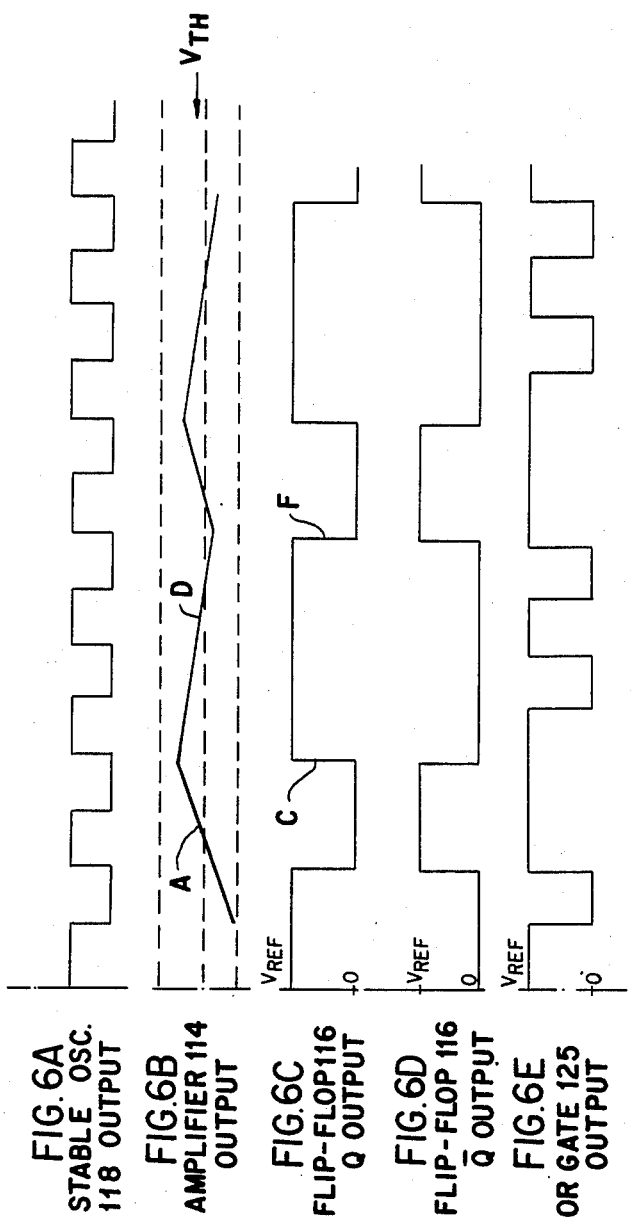

CHARGE BALANCE VOLTAGE-TO-FREQUENCY CONVERTER UTILIZING CMOS CIRCUITRY

This application is a continuation of application Ser. No. 492,533, filed May 9, 1983, now abandoned.

BACKGROUND OF THE INVENTION

1. Field of the Invention

The present invention relates generally to voltage-to-frequency converters. More particularly, the present invention is directed towards a novel charge balance voltage-to-frequency converter utilizing CMOS circuity to provide a digital pulse output proportional to an analog voltage input signal.

2. Description of Related Art

Voltage-to-frequency converters are well known. Broadly, a voltage-to-frequency converter produces an output frequency proportional to the level of an input signal. Voltage-to-frequency converters have been implemented using a variety of technologies, including transistor-to-transistor logic (TTL) and complementary metal oxide structure (CMOS). Charge balancing in such converters is desirable because the integrating capacitor's tolerance does not affect the accuracy of the conversion.

One example of a conventional voltage-to-frequency converter is the integrating section of a device produced by Scientific Columbus, of Columbus, Ohio, designated SC-60 Watt/Watthour Standard, which produces an output pulse train whose frequency is proportional to the power level of an input signal. The voltage level and the current level of the input signal are modulated to produce a signal whose pulse width and pulse amplitude are varied in proportion to the average power level of the input signal. This modulated signal is applied to the input of an integrator. Also applied to this input is a gated negative current source signal whose duration is controlled by the output signal from a quartz crystal referenced monostable multivibrator. The gated signal from the current source is added to the modulated signal at the input of the integrator. The output from the integrator is applied to a first input of a comparator, whose second input is connected to a voltage reference source. This circuit requires the use of a dual polarity power supply. The output of the comparator, which is a high repetition rate pulse train whose rate is accurately proportional to the power level of the input signal, is provided to the input of a divider and to the input of the quartz crystal referenced monostable multivibrator. The divider provides driving pulses at a desired rate to isolated open-collector output stages.

Another conventional voltage-to-frequency converter is a device designated 8700 CMOS A/D Converter, produced by Teledyne Corporation, of Hawthorne, Calif. This monolithic integrated circuit chip performs A/D conversion utilizing CMOS circuitry to provide a charge balancing of the output of an integrating amplifier. The input signal to the circuit is fed to the inverting terminal of an integrating amplifier. The output of the integrating amplifier is compared by a comparator to a threshold voltage generated by an internal clock and control logic. The output of the comparator, in combination with an internal clock, generated by the internal clock and control logic, controls a switch used to gate a reference voltage, $V_{REF}$, which is applied to the inverting input of the integrating amplifier to provide the charge balancing of the amplifier output. The application of the reference voltage to the inverting input necessitates the use of a dual polarity power supply. The output of the internal clock and control logic is applied to data counters, whose output is supplied, via a bus, to output latches. These stages accumulate the number of $V_{REF}$ pulses required to charge balance the output of the integrating amplifier over a predetermined time interval.

While the Teledyne circuit is superior in some respects to the charge balancing techniques previously discussed, it has its own deficiencies. For example, it requires separate comparator, switch, internal clock and control logic, data counter and output latch stages. Its output is limited to a binary word based on a given conversion period. Therefore, the output of the circuit is only applicable to a limited number of applications where the conversion period of the circuit corresponds to the sample period desired. It also requires a dual polarity power supply. Additionally, since the clock controlling the feedback pulses and the data acquisition are internal, the conversion period cannot be varied to optimally suit a given application.

SUMMARY OF THE INVENTION

The present invention is a charge balance voltage-to-frequency converter which utilizes CMOS circuitry to provide a digital pulse output proportional to an analog input signal.

Broadly, the present invention provides an output pulse train whose frequency is proportional to the level of an input signal $V_{IN}$. The $V_{IN}$ signal is fed to the non-inverting input of an integrating amplifier comprising an operational amplifier with a capacitor connected between its output and its inverting input. The output of the integrating amplifier is fed to the input of a CMOS flip-flop, such as a D-type flip-flop. The input of the flip-flop (labeled by convention as the D input) has a threshold value which when exceeded causes the flip-flop to produce a logic high output on the rising edge of the next clock pulse received at its clock input. The flip-flop receives the clock signal at its clock input from a stable oscillator. When the integrating amplifier output rises above the threshold level of the flip-flop input, the flip-flop produces a pulse at its output (labeled by convention as the Q output) on the next rising edge of the clock signal. This pulse is fed back to the inverting terminal of the integrating amplifier, and acts to "charge balance" the amplifier output. Only a single polarity power supply is required since the feedback pulses are applied to the inverting input of the integrating amplifier.

In a first embodiment, the signal at the Q output of the flip-flop is combined with the clock signal in a CMOS AND gate to produce an output pulse train indicative of the charge necessary to balance the input signal.

In a second embodiment, the signal at the $\overline{Q}$ output of the flip-flop is combined with the clock signal in a CMOS OR gate to produce the output pulse train indicative of the charge necessary to balance the input signal.

The CMOS flip-flop of the present invention performs four functions: it acts as a comparator of the output signal from the integrating amplifier; it acts as a switch in providing feedback pulses to the inverting input of the integrating amplifier; it provides a flip-flop function, in that it produces an output signal of the same state as the signal present at its input on the rising edge of the next clock pulse; and it serves as an A/D converter by producing a digital pulse output from an analog voltage input. Certain of these functions are described below in greater detail.

Specifically, the D input stage of the CMOS flip-flop eliminates the requirement for a separate comparator in the circuit of the present invention. The D input stage of the CMOS flip-flop comprises a pair of FET devices connected across the supply voltage and ground. The FET devices function as a very consistent comparator because their change in conductive state always occurs at the exact same voltage level over the lifetime of the devices. When the level of the signal present at the D input crosses the particular threshold of the FET devices in the CMOS flip-flop device, the output of the FET devices change state. As discussed above, the threshold level of the input stage of a given CMOS flip-flop is quite precise and is accurately repeatable. Hence, the CMOS input stage of the CMOS flip-flop functions as an excellent comparator.

Additionally, the Q output stage of the CMOS flip-flop advantageously eliminates the need for a separate switch in the charge balance circuit of the present invention. The voltage level at the Q output of the CMOS flip-flop is determined by the state of the FET devices of the D input stage of the flip-flop. Since the output stage of the CMOS device is connected directly between the source voltage and ground, there is very little voltage drop between the flip-flop Q output and the source voltage (when the flip-flop Q output is "high") or between the flip-flop output and ground (when the flip-flop Q output is "low"). Hence, the Q output voltage level of the flip-flop Q is essentially equal to the source voltage when the flip-flop Q output is "high", and is essentially equal to the ground when the flip-flop Q output is "low".

The use of CMOS circuitry in the present invention also advantageously requires only a single polarity power supply and can function with a supply voltage which may vary over a broad range. The lack of criticality in the supply voltage level is due to the ability of CMOS to operate effectively over a broad voltage supply range. This is to be contrasted to TTL circuitry, which requires a supply voltage in a very narrow range for effective operation. Furthermore, CMOS circuitry consumes much less power than TTL circuitry to perform a given function.

The output of the present invention is a pulse train which may be utilized in a broad range of applications with a variety of data acquisition circuits.

BRIEF DESCRIPTION OF THE DRAWING FIGURES

These and other features and advantages of the present invention will be readily understood from the following description of the present invention, when considered in connection with the accompanying drawings, wherein:

FIG. 1 is a schematic diagram of an embodiment of the voltage-to-frequency circuit of the present invention;

FIG. 2 is a schematic diagram of the power supply circuit for the present invention;

FIG. 3 is a simplified representation of the input and output stages of the CMOS D-type flip-flop employed in the present invention;

FIGS. 4A-4E are timing diagrams for the embodiment of the voltage-to-frequency converter of the present invention shown in FIG. 1;

FIGS. 6A-6E are timing diagrams for the alternative embodiment of the present invention shown in FIG. 5.

DETAILED DESCRIPTION OF THE PREFERRED EMBODIMENT

Figure 5:
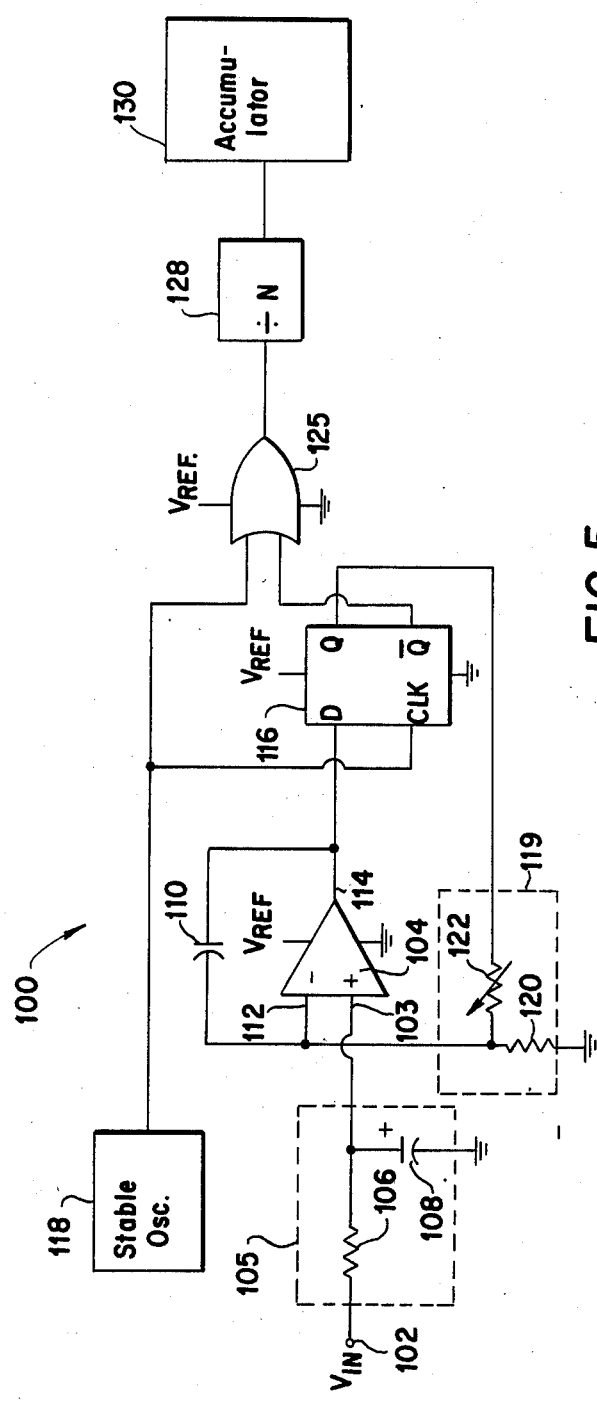
FIG. 5 is a schematic diagram of an alternative embodiment of the present invention.

The present invention relates generally to abandoned U.S. Pat. application Ser. No. 094,177, filed Nov. 14, 1979, titled "A Watthour to Pulse Rate Transducer", by the same inventor as the present application, the disclosure of which is incorporated by reference herein.

With reference to FIG. 1, an input signal $V_{IN}$ is applied at input 102 to the circuit of the present invention, designated generally by the reference number 100. Input signal $V_{IN}$ is coupled to the non-inverting input 103 of an amplifier 104 through a low pass filter 105, which comprises a resistor 106 and a capacitor 108. Low pass filter 105 eliminates AC ripple on the input signal $V_{IN}$ so that amplifier 104 sees only the slowly-varying DC component of input signal $V_{IN}$. Low pass filter 105 can be eliminated if there is no significant AC ripple.

Amplifier 104 is configured as an integrator. Specifically, it has a capacitor 110 connected in a feedback path between its inverting input 112 and its output 114. Amplifier 104 is preferably a low-offset amplifier, such as a chopper stabilized amplifier Part No. ICL7650, produced by the Intersil Corporation of Cupertino, Calif. Note, however, that any suitable low-offset amplifier may be employed in the present invention.

The output of amplifier 104 is connected to the D input of a CMOS D-type flip-flop 116. A D-type flip-flop is characterized by duplicating at its Q output an input signal which is present at its D input upon the application of either the rising or falling edge of a clock signal (depending on the flip-flop design) at the clock input of the flip-flop. Flip-flop 116 may consist of, for example, a CD4013 D-type flip-flop produced by RCA Corporation of Somerville, N.J. It should be understood that any suitable type of CMOS flip-flop could be used to implement the D-type flip-flop function. For example, a CMOS JK-type flip-flop could be used with the K input inverted and the J and inverted K leads tied together.

Flip-flop 116 receives timing signals at its clock input from a stable oscillator 118. For correct operation of the present invention, stable oscillator 118 must produce an accurately timed clock signal. Preferably, stable oscillator 118 is crystal controlled; in the preferred embodiment of the invention, a commercial watch crystal is employed in stable oscillator 116 and has a frequency of 32.768 KHz.

Referring now to FIG. 3, CMOS flip-flop 116 is shown in a very simplified form as having an input stage 302 and an output stage 304. Input stage 302 comprises a pair of FET transistors 306 and 308 connected across supply voltage $V_{DD}$ and ground $V_{SS}$. Note that $V_{REF}$ is applied as $V_{DD}$ as the supply voltage in the embodiment shown in FIG. 1. Input stage 302 includes an input 310 and an output 312. When the level of the signal present at input 310 crosses the threshold level, $V_{TH}$, of FET transistors 306 and 308, transistors 306, 308 change their respective states of conductivity. This results in a change of voltage level at output 312.

The threshold level of the particular FET devices 306, 308 in a given CMOS D-type flip-flop is very precise. For this reason, CMOS input stage 302 functions as an excellent comparator. In contrast, TTL circuitry is unsatisfactory in this regard, since the threshold level present at a TTL input tends to vary over a relatively broad range each time the device changes state.

Output stage 304 of flip-flop 116 comprises a pair of electronic switches connected directly between source voltage $V_{DD}$ and ground $V_{SS}$. Output stage 304 includes an input 314 and an output 316. The voltage level at output 316 may be either "high" or "low", and is determined by the state of output 312 of input stage 302 and the rising edge of the clock pulse (not shown in FIG. 3). Since output stage 304 is connected directly between source voltage $V_{DD}$ and ground $V_{SS}$, the voltage level at output 316 is either essentially $V_{SS}$ (when output 316 is "high") or $V_{DD}$ (when output 316 is "low"). Thus, CMOS output stage 304 functions as an excellent switch. In contrast, the output voltage of TTL circuitry is generally varies over a relatively broad range each time the device changes state.

Flip-flop 116 of the present invention acts as an A/D converter, since it converts an analog input signal to a digital output signal. It also acts as a generator of specific amounts of feedback charge to integrating amplifier 104. Thus, D-type flip-flop 116 must have a precise voltage threshold level at its D input, and an accurate output voltage level at its Q output. For these reasons, the application of a TTL D-type flip-flop in the circuit of the present invention would not provide proper operation of the circuit. Conversely, the application of a CMOS D-type flip-flop in the circuit of the present invention provides all the necessary functions discussed above; it also eliminates the need for a separate comparator and a switch.

The Q output of flip-flop 116 is used to provide feedback pulses to charge balance the output of integrating amplifier 104. The Q output of flip-flop 116 is connected to the inverting input 112 of integrating amplifier 104 through a voltage divider 119 comprised of resistors 120 and 122. Resistor 122 is variable and may be used to adjust the charge balance point of the circuit in order to set the maximum input to correspond to full scale output.

In the first preferred embodiment of the present invention, the Q output of flip-flop 116 is also coupled to one input of a CMOS AND gate 124. AND gate 124 comprises a CMOS AND gate, such as a model CD4081 AND gate, produced by RCA Corporation of Somerville, N.J. The other input of AND gate 124 is coupled to stable oscillator 118 through an inverter 126. The output of AND gate 124 is coupled to a divide-by-N counter 128 which, in turn, is connected to an accumulator 130. Accumulator 130 may comprise, for example, a microprocessor.

Amplifier 104, flip-flop 116, and AND gate 124 are advantageously all powered by a single source voltage $V_{REF}$. Source voltage $V_{REF}$ is produced, for example, by the circuit shown in FIG. 2. A positive voltage $V_+$ is applied to one side of a current limiting resistor 202. The other side of resistor 202 is coupled to a voltage regulator 204. In the preferred embodiment, regulator 204 consists of an LM326-5 voltage regulator manufactured by National Semiconductor of Santa Clara, Calif. However, any suitable voltage regulator 204 could be employed in the present invention. A capacitor 206 is applied across regulator 204 to stabilize the regulator and to filter noise from the power supply $V_{REF}$.

Referring to FIG. 4, the signal applied to the non-inverting input 103 of operational amplifier 104 causes capacitor 110 to charge and raises the level of output 114 above $V_{TH}$ (as stated previously, $V_{TH}$ is the threshold voltage at which the comparator at the D input of flip-flop 116 will change state). The charging of capacitor 110 is shown in the initial segment designated "A" in the timing diagram of FIG. 4B. In response, as shown in FIG. 4C at falling edge "B", output 312 of input stage 302 at the D input of flip-flop 116 goes low. Upon receiving the rising edge G (FIG. 4A) of the next clock pulse at its clock input, flip-flop 116 produces a logic high on its output (see FIG. 4D, rising edge "C"). The high signal at the Q output of flip-flop 116 is now transferred as a feedback signal through voltage divider 119 to the inverting terminal 112 of amplifier 104. Referring again to FIG. 4B, at the segment designated by "D", this feedback signal or pulse causes capacitor 110 to discharge a predetermined amount. Flip-flop 116 can only change states at the leading edge of each clock pulse from stable oscillator 118. The Q output of flip-flop 116 remains high for an integral number of clock cycles (one or more), causing a "charge balancing" of capacitor 110 in known increments.

The clocking of flip-flop 116 by stable oscillator 118 assures that the feedback pulses coupled from stable oscillator 118 to amplifier 104 are precise in width. As a result, each feedback pulse balances out a precise amount of charge input to non-inverting input 103 of amplifier 104. In other words, each feedback pulse represents a precise amount of charge required to balance a corresponding amount of charge at input terminal 102.

When a sufficient number of pulses have been received by amplifier 104 at its non-inverting input 103 to drive output 114 below $V_{TH}$, output 312 of input stage 302 at the D input of CMOS flip-flop 116 changes state to a logic high (see FIG. 4C, rising edge "E"). Upon receiving rising edge H (FIG. 4A) of the next clock pulse at its D input, flip-flop 116 then delivers a logic low signal on its Q output (see FIG. 4D, falling edge "F"), thus terminating feedback pulses to amplifier 104.

Thereafter, the signal input $V_{IN}$ on terminal 102 applied to the non-inverting terminal 103 of amplifier 104 will charge the amplifier output to a point above the threshold voltage $V_{TH}$, and the cycle will continue. This cycling of charging and discharging causes output 114 of amplifier 104 to oscillate slightly above and below $V_{TH}$. As mentioned previously, the amount of feedback pulses applied to inverting input 103 of amplifier 104 required to maintain output 114 of amplifier 104 at this relatively constant level is indicative of the voltage applied at non-inverting input 103, since the feedback pulses exactly balance the input at this quiescent point.

In the first preferred embodiment, AND gate 124 is used for producing an output pulse train in which the pulses appear at a rate proportional to the input voltage. AND gate 124 combines signals from stable oscillator 118 and the Q output of flip-flop 116 to produce this pulse train. As shown in FIG. 4E, whenever the flip-flop Q output is high and the stable oscillator 118 is low, AND gate 124 produces a logic high.

Hence, in operation, AND gate 124 will produce pulses at its output whenever flip-flop 116 is providing feedback pulses. As a result, the output of AND gate 124 will be pulse a train which has a rate proportional to the signal at input terminal 102 of circuit 100 of the circuit. In the example illustrated in FIG. 4E, two output pulses are produced for every three clock pulses (FIG. 4A), indicating that input $V_{IN}$ is two-thirds of full scale (as set by resistor 122).

In the first preferred embodiment, inverter 126 prevents an anomolous pulse from appearing at the output of AND gate 124 on the edge of the clock pulse which clocks flip-flop 116. Flip-flop 116 is clocked on the leading edge of the clock pulse from oscillator 118, whereas AND gate 124 is "satisfied" (if at all) following the trailing edge of the clock pulse.

It is apparent that AND gate 124 could be replaced by an OR gate 125 with one input directly connected to stable oscillator 118 and another input connected to the $\overline{Q}$ output of flip-flop 116. FIG. 5 is a schematic diagram of such an alternative embodiment. FIGS. 6A-6E are timing diagrams for the embodiment of FIG. 5.

Divide-by-N counter 128 is connected to the output of AND gate 124 in the first embodiment, and to the output of OR gate 125 in the second embodiment, in order to reduce the pulse rate to the desired data rate. The resultant lower frequency pulse train is then passed to an accumulator 130, which processes the pulses.

While the present invention has been described in considerable detail, it is understood that numerous modifications and variations fall within the scope of the appended claims.

I claim as my invention:

1. A highly precise charge balance voltage-to-frequency converter requiring only a single polarity voltage power supply, comprising:
   (a) integrator means, having a first input for receiving an input signal and a second input for receiving a feedback signal having a high state and a low state, for producing a first output signal as a function of the integral of the difference between the input signal and the feedback signal;
   (b) reference oscillator means for generating a clock signal having first and second logic states;
   (c) CMOS flip-flop means having a stable internal voltage threshold level derived from said voltage power supply and an input responsive to said first output signal and having a clock input responsive to said clock signal for producing said feedback signal at an output terminal of said flip-flop means when the magnitude of said first output signal and said voltage threshold level during an occurrence of said clock signal have a predetermined relationship:
   (d) logic means, having a first input responsive to said clock signal and a second input responsive to said feedback signal, for producing an output pulse each time said clock signal and said feedback signal are in a common predetermined logic state;
   (e) linear circuit means interconnecting said output terminal of said CMOS flip-flop means and said second input of said integrator means to form a continuous circuit path for said feedback signal; and
   (f) accumulator means for accumulating a preselected proportion of the output pulses produced by said logic means, whereby the number of such output pulses so accumulated is indicative of a parameter of said input signal.

2. The converter of claim 1, wherein said integrator means comprises:
   (a) operational amplifier means having a first input for receiving said input signal, and a second input for receiving said feedback signal, and an output for producing said first output signal; and
   (b) a capacitor connected between said output and said second input of said operational amplifier means and responsive to said first output signal and said feedback signal whereby the amount of charge present on said capacitor is continuously balanced.

3. The converter of claim 1, wherein said reference oscillator means comprises a crystal oscillator.

4. The converter of claim 1, wherein said CMOS flip-flop means comprises a D-type flip-flop having FET input means responsive to said first output signal for producing a second output signal in a low state when said first output signal exceeds a threshold level.

5. The converter of claim 4, wherein said CMOS flip-flop means further includes electronic switch means for providing said feedback signal in said high state when said second output signal is in said low state and said clock signal is changing state.

6. The converter of claim 1, wherein said logic means comprises AND gate means having a first input responsive to said clock signal, a second input responsive to said feedback signal, and an output for producing said output pulse.

7. The converter of claim 6, wherein said logic means further comprises inverter means having an input responsive to said clock signal and an output connected to said first input of said AND gate for inverting said clock signal.

8. A highly precise charge balance voltage-to-frequency converter requiring only a single polarity voltage power supply, comprising:
   (a) integrator means, having a first input for receiving an input signal and a second input for receiving a feedback signal having a high state and a low state, for producing a first output signal as a function of the integral of the difference between the input signal and the feedback signal;
   (b) reference oscillator means for generating a clock signal having first and second logic states;
   (c) CMOS flip flop means, having a stable internal voltage threshold level derived from said voltage power supply and an input responsive to said first output signal and having a clock input responsive to said clock signal, for producing said feedback signal at an output terminal when the magnitude of said first output signal and said voltage threshold level during an occurrence of said clock signal have a predetermined relationship and for producing an inverted feedback signal;
   (d) logic means having a first input responsive to said clock signal and a second input responsive to said inverted feedback signal for producing an output pulse each time said clock signal or said inverted feedback signal, or both, are in a predetermined logic state;
   (e) linear circuit means interconnecting said output terminal of said CMOS flip-flop means and said second input of said integrator means to form a continuous circuit path for said feedback signal; and
   (f) accumulator means for accumulating a preselected proportion of the output pulses produced by said logic means, whereby the number of such output pulses so accumulated is indicative of a parameter of said input signal.

9. The converter of claim 8, wherein said integrator means comprises:
   (a) operational amplifier means having a first input for receiving said input signal, and a second input for receiving said feedback signal, and an output for producing said first output signal; and (b) a capacitor connected between said output and said second input of said operational amplifier means and responsive to said first output signal and said feedback signal whereby the amount of charge present on said capacitor is continuously balanced.

10. The converter of claim 8, wherein said reference oscillator means comprises a crystal oscillator.

11. The converter of claim 8, wherein said CMOS flip-flop means comprises a D-type flip-flop having FET input means responsive to said first output signal for producing a second output signal in a low state when said first output signal exceeds a threshold level.

12. The converter of claim 11, wherein said CMOS flip-flop means further includes electronic switch means for providing said feedback signal in said high state when said second output signal is in said low state and said clock signal is changing state.

13. The converter of claim 8, wherein said logic means comprises OR gate means having a first input responsive to said clock signal, a second input responsive to said inverted feedback signal, and an output for producing said output pulse.

* * * * *